United States Patent [19]

Moreland et al.

[11] Patent Number: 5,375,087
[45] Date of Patent: Dec. 20, 1994

[54] TUNNELING-STABILIZED MAGNETIC READING AND RECORDING

[75] Inventors: John M. Moreland, Louisville; Paul Rice, Boulder, both of Colo.

[73] Assignee: The United States of America as represented by the Secretary of Commerce, Washington, D.C.

[21] Appl. No.: 650,112

[22] Filed: Feb. 4, 1991

[51] Int. Cl.$^5$ .............. G11C 11/00; G11C 13/00; G01N 23/00; G21K 7/00
[52] U.S. Cl. .................... 365/151; 250/306
[58] Field of Search .............. 365/151; 250/306, 307; 324/201, 226, 248

[56] References Cited

U.S. PATENT DOCUMENTS

| | | | |
|---|---|---|---|
| 4,861,990 | 8/1989 | Coley | 324/201 |
| 4,916,688 | 4/1990 | Foster et al. | 365/151 X |
| 4,939,363 | 7/1990 | Bando et al. | 250/306 |
| 4,943,719 | 7/1990 | Akamine et al. | 250/306 |
| 4,992,659 | 2/1991 | Abraham et al. | 250/306 |
| 5,015,850 | 5/1991 | Zdeblick et al. | 250/306 |
| 5,051,329 | 9/1991 | Bayer et al. | 250/306 |
| 5,079,958 | 1/1992 | Takase et al. | 73/862.64 |
| 5,103,174 | 4/1992 | Wandass et al. | 324/226 |
| 5,103,682 | 4/1992 | Moreland et al. | 324/248 |

OTHER PUBLICATIONS

Binnig et al., "Tunneling Through a Controllable Vacuum Gap", *App. Phys. Lett.* 40(2), 178–180 (1982).
Binnig et al, "Atomic Force Microscope", *Phys. Rev. Lett.*, 56(9), 930–933 (1986).
Hobbs et al, "Magnetic Force Microscopy with 25 nm Resolution", *Applied Physics Letters*, 55(22) 2357–2359, (1989).
Goddenhenrich, et al, "Investigation of Bloch Wall Fine Structures by Magnetic Force Microscopy", *J. Microscopy*, 152(2), 527–536 (1988).
Rugar, et al, "Magnetic Force Microscopy: General Principles and Application to Longitudinal Recording Media", *J. Appl. Phys.*, 68, 1169–1183 (1990).
Saenz et al, "Observation of Magnetic Forces by the Atomic Force Microscope", *J. Appl. Phys.*, 62(10), 4293–4295 (1987).
Moreland, et al, "High-Resolution, Tunneling-Stabilized Magnetic Imaging and Recording", *Appl. Phys. Lett.*, 57(3) 310–312, (1990).

*Primary Examiner*—Joseph L. Dixon
*Assistant Examiner*—Michael A. Whitfield
*Attorney, Agent, or Firm*—Michael de Angeli

[57] ABSTRACT

This invention relates principally to methods and apparatus for recording data on and reading data from a magnetizable medium using a scanning tunneling technique. Conventional rigid probes used in scanning tunneling microscopy (STM) and the like are replaced by a compliant magnetic probe wherein the STM image is a convolution of magnetic forces and the surface topography of the magnetizable medium. Data can be written to the medium by increasing the tunneling current, reducing the scan rate, and/or increasing the magnetization of the compliant magnetic tunneling tip in order to alter the local magnetic characteristics of the medium. A preferred material for the compliant probe is a freestanding thin film of iron vacuum-deposited on a glass substrate and later removed therefrom.

The compliant probe of the invention may also be employed for imaging the local surface magnetization of a magnetic member.

14 Claims, 1 Drawing Sheet

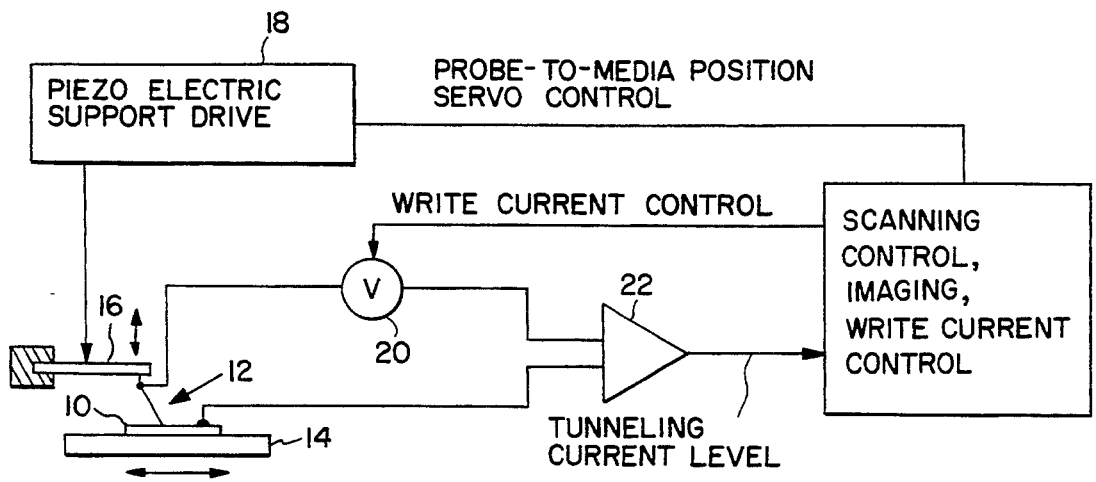
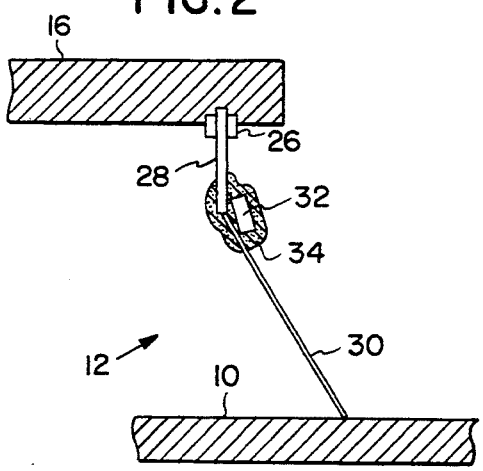
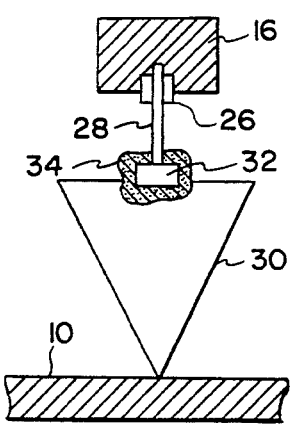
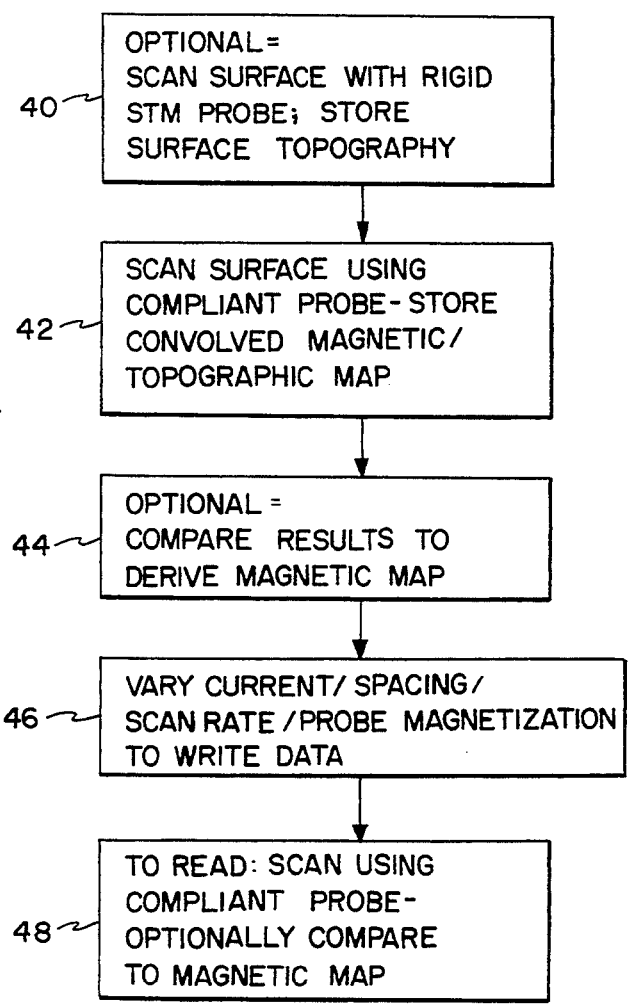

TUNNELING-STABILIZED MAGNETIC READING AND RECORDING

FIELD OF THE INVENTION

This invention relates to improved techniques for magnetic recording and reading. More particularly, this invention relates to an improved method for magnetic recording and reading, in which previously known techniques employing tunneling probes for surface topographic measurement and surface magnetization measurements are modified for reading data from and writing data to a magnetic medium. The invention also has general application for imaging microscopic magnetic regions on the surface of magnetic materials.

BACKGROUND OF THE INVENTION

In the last few years, much attention has been paid to very precise surface topographical mapping performed using so-called "tunneling" techniques, referred to as scanning tunneling microscopy ("STM"). The pioneering work was done by Binnig et al and has been widely publicized. In this technique, an extremely sharp probe, having a point on the order of atomic dimensions in radius, is closely juxtaposed to a surface to be imaged. When the probe approaches the surface to within a few nanometers and a small electric potential is applied therebetween, a tunneling current flows therebetween, even though there is no direct contact. The resistance of the tunneling junction thus formed varies exponentially with the spacing of the point from the surface. If the probe is scanned over the surface while the probe-to-surface spacing is controlled by a servo loop arranged to maintain the tunneling current constant, the probe will be moved up and down away from the nominal plane of the surface in a manner corresponding to the surface topography. Accordingly, variations in the servo control signal are directly responsive to variations in the surface topography and can be used to image the surface.

The principle of detecting a tunneling current and using it to measure distance has been employed in controlling the height of a conventional inductive read/write head from a magnetizable medium in U.S. Pat. No. 4,853,810 to Pohl et al.

In U.S. Pat. No. 4,831,614 to Duerig et al, variations in tunneling current are used to read and write data to a storage medium. The preferred embodiment of the Duerig et al device appears to involve the trapping of electrons in the medium rather than variation in the local magnetic characteristics thereof per se. See column 2, line 62—column 3, line 2. In Duerig et al a plurality of scanning tips arranged in an orthogonal array are disposed in close juxtaposition to a storage medium which is disposed on the end of a cylinder of piezoelectric material. The piezoelectric material is driven such that the storage medium rotates circularly with respect to the stationary read/write tips. Accordingly, the medium effectively circles around each of the individual read/write tips, each having an individual circular storage area.

By comparison, in the Pohl et al patent, the medium and the head are themselves conventional and the tunneling electrode is merely used to control their spacing. In both Pohl et al and Duerig et al the head is rigidly mounted and there is no compliance intended in the head mounting arrangements.

In Quate U.S. Pat. No. 4,575,822, data is stored on a substrate by perturbing its electrical or physical characteristics. The data is then read by scanning a tunneling probe over the surface and measuring variations in the tunneling current. Quate does not suggest that the tunneling probe should be compliant.

In Hobbs et al, "Magnetic Force Microscopy with 25 nm Resolution", *Applied Physics Letters*, 55(22) (1989), in Goddenhenrich et al, "Investigation of Bloch Wall Fine Structures by Magnetic Force Microscopy", *Journal of Microscopy*, 152(2) (1988), and Rugar et al, "Magnetic Force Microscopy: General Principles and Application of Longitudinal Recording Media", *Journal of Applied Physics* 68, 1169–1183 (1990), related magnetic force microscopy (MFM) techniques are disclosed. In MFM, localized variations in surface magnetic characteristics of members are imaged by detecting variations in magnetic force between a probe comparable to a tunneling probe and a substrate. In the Goddenhenrich et al paper, the probe is oscillated by a piezoelectric oscillator and variations in its resonant frequency due to variations in the local magnetic field are used to "map" the magnetic field. It is disclosed in Goddenhenrich et al that conventional scanning tunneling microscopy techniques can also be used to map the surface topography, and these maps can be compared to measure any correlation between variations in the local magnetization and the surface topography. See the paragraph extending between pages 529 and 531 of the Goddenhenrich paper.

In the Hobbs et al paper, a magnetic member closely juxtaposed to a sample is driven at frequencies varying slightly from the resonant frequency of the tip/drive system. Any change in the force existing between the tip and the sample alters the resonant frequency and can thus be detected to determine atomic and magnetic forces. The distance between the tip and the substrate is measured optically using complex interferometric techniques.

In Saenz et al, "Observation of Magnetic Forces by the Atomic Force Microscope", *J. Appl. Phys.* 62(10), (1987), there is discussed an atomic force microscope wherein a sharp tip attached to a tiny cantilever is used to map the contours of the sample. The atomic forces between the tip and the sample are detected by measuring the deflection of the lever. This publication also teaches that magnetic forces can be measured with the same apparatus.

SUMMARY OF THE INVENTION

According to the present invention, the conventional rigid probe of a scanning tunneling microscope (STM) is replaced with a compliant probe formed of a magnetic material. When this probe is disposed in juxtaposition to a magnetized disk such as a conventional computer "hard disk", a magnetic force exists between the compliant probe and the disk. As the compliant probe is scanned over the disk, variations in the magnetic force are experienced by the probe due to local variations in magnetization. If the magnetic probe is used in the typical manner for STM, i.e., in a servo loop arranged to keep the tunneling current constant, then the probe-to-substrate spacing is maintained constant. As the magnetic force on the probe changes responsive to local variation in magnetization of the medium, the probe flexes responsive to the change in the force on the tip, and the servo loop must adjust the nominal probe height in order to maintain the tip-to-substrate spacing constant. The images recorded by the STM in this mode are thus convolutions of the magnetic force experienced with variations in the surface topography per se. This process may be referred to as tunneling stabilized magnetic force microscopy.

If the surface has been previously topographically mapped, e.g. using a conventional rigid STM probe, the results of the two scans can be compared and used to yield a surface magnetic "map". If the compliance of the tip is high enough, changes in the tip-to-medium spacing due to the surface topography compared to changes due to bending of the probe responsive to local variations in the magnetic force are negligible.

If it is then desired to write data to the surface by altering the local magnetic characteristics thereof, this can be done simply by increasing the scanning current, decreasing the scan rate, and/or increasing the magnetization applied between the probe and the substrate. A local magnetic field at the tip of the probe will alter the local magnetic characteristics of the substrate. If the compliant probe is later scanned over the surface, these local magnetic variations can be detected. If the variations in local magnetization written to the medium are comparable in magnitude to the features previously observed on the surface, the variations written can be detected by comparison of the magnetic map generated after reading with the prior map.

BRIEF DESCRIPTION OF THE DRAWINGS

The invention will be better understood if reference is made to the accompanying drawings, in which:

FIG. 1 shows a block diagram view of an overall system for magnetic reading and recording according to the invention;

FIG. 2 shows a side view of the assembly of the compliant probe according to the invention;

FIG. 3 shows an end view of the assembly shown in FIG. 2; and

FIG. 4 shows a block diagram of the steps required for recording data on and reading data from a magnetic medium according to the invention.

DESCRIPTION OF THE PREFERRED EMBODIMENTS

The apparatus employed to practice the invention is essentially identical to that previously used by numerous workers to perform scanning tunneling microscopy (STM) studies, with the exception that according to the invention a compliant tunneling probe detailed in connection with FIGS. 2 and 3 is substituted for conventional rigid tunneling probes. FIG. 1 shows a block diagram view of a suitable STM system which can be modified by replacement of the probe to perform the method of the invention.

In FIG. 1, a magnetic recording medium 10, which may typically be all or part of a complete "hard disk" as conventionally used, is mounted on an apparatus 14 for translation of the medium 10 with respect to a tunneling probe assembly 12. The apparatus 14 for translation of the medium with respect to the probe assembly 12 could ultimately be a conventional rotating disk drive, a tape drive or the equivalent. The probe assembly 12 is mounted on a member 16 which is adapted to provide controllable vertical movement of the probe 12 with respect to the medium 10. In conventional STMs, vertical movement is provided by piezoelectric actuators 16 and conventional drive circuitry 18. Such apparatus is commercially available. A source of dc potential is connected between the probe assembly 12 and the magnetic medium 10. When the probe approaches the medium 10 to within a few nanometers, a tunneling current flows therebetween. This current is detected by circuitry indicated schematically at 22. Again as conventionally, the current is used in a servo loop to drive the piezoelectric element control circuitry 18, so as to maintain the probe 12 at a constant distance from the medium 10.

Movement of the probe 12 with respect to the medium 10 is controlled by a control unit indicated generally at 24. Such devices are generally within the skill of the art and operate to scan the probe over the medium 10, e.g. by moving the probe in a raster scan fashion over a generally square area on the medium 10, by moving the probe radially with respect to a rotating medium 10, or otherwise. The scanning device 24 must ensure that the probe can be repeatably scanned over the same portion of the medium 10, so that data can be repeatably located on and retrieved from the recording surface.

FIGS. 2 and 3 show enlarged side and end views respectively of the probe assembly 12 and the vertical drive element 16. Typically the piezoelectric element 16 as currently available includes a collet 26 for receiving a support wire 28. The probe may comprise a thin iron film 30 formed by vapor deposition on a glass substrate at elevated temperature. When the assembly cools, the iron film peels off the glass substrate, leaving a very uniform, very high quality film. This can then be cut with scissors into the shape of an isosceles triangle having an extremely sharp point approaching atomic dimensions.

Other suitable materials for the film include nickel or possibly alloy materials which are ferromagnetic but resist corrosion. The inventors have also had some success in using nickel and iron films coated with gold for corrosion resistance. As indicated above, the medium 10 in successful experiments has simply been a section cut from a conventional "hard disk" as supplied in numerous personal computers. Other magnetizable media are also known.

In one embodiment of the invention it is desirable to have the film permanently magnetized. Accordingly, in this embodiment, a permanent magnet 32 is mounted to the probe 30 by a adhesive silver paint 34 or the equivalent. In other embodiments of the invention an electromagnet could be used to intermittently magnetize the magnetic tunneling probe film 30.

Reference should also be made to the inventors' paper "High Resolution Tunneling Stabilized Magnetic Imaging and Recording", Moreland et al, *Applied Physics Letters*, 57(3), pp. 310–312, (1990), for additional details of experiments performed to date, detailed component specifications and the like. This paper is incorporated herein by reference.

The surfaces of conventional computer hard disks are permanently magnetized such that when the foil probe 30 which is itself magnetized by the permanent magnet 32 is juxtaposed to the probe, a magnetic force exists therebetween. As noted above, the same effect could be obtained by using an appropriately polarized electromagnet in place of the permanent magnet 32. As the tunneling probe is scanned over the medium 10, the magnetic force changes. This necessitates that the probe be forced closer to the medium by the piezoelectric drive element 18 (FIG. 1) while the current is increased in order to locally alter the magnetic characteristics of the medium 10 and thus to "write" a "bit" of "data" to the medium.

As indicated above, the probe 30 according to the invention is compliant, that is, is not rigid. Accordingly, when it experiences a variation in magnetic force between itself and the surface of the media 10, it deflects. The servo loop then compensates for the variation in spacing; hence the servo current varies responsive to both surface topography and local variations in magnetic field. By comparison, a rigid probe does not deflect in response to a local magnetic field; therefore variations in the servo current cannot be used to image the magnetic field. For the compliant probe according to the invention, the probe-to-media spacing is a function of the magnetic force, which may be either attractive or repulsive, and varies with variation in local magnetization of the media 10, the physical characteristics of the probe, and of the surface topography of the media 10. Therefore, the compliant probe according to the invention can be used to image the near-surface magnetic characteristics of the medium as well as the surface topography of the medium.

The local magnetic characteristics of the medium can be varied, "writing data" to the medium, by varying the tunneling current, reducing the scanning rate of the probe, and/or varying the magnetization of the probe with an electromagnet as the probe is scanned with respect to the medium. Data can subsequently be "read" from the medium by imaging the surface using the compliant probe according to the invention.

More specifically, it is to be recalled that the probe of the invention is disposed in a servo loop, the function of which is to attempt to keep the tunneling junction resistance constant. If a rigid probe is scanned over a medium, it is not deflected by variations in local magnetic field. Therefore, these variations do not perturb the servo loop, and variations of the servo loop current cannot be used to image the local magnetic field. By comparison, using the compliant probe of the invention, variations in magnetic field cause the probe to deflect. The servo loop corrects for these deflections and therefore the servo current varies responsive to variations in local magnetic field as well as variations in surface topography.

When it is sought to write data to the medium in accordance with the invention, that is, using the compliant probe, one would normally increase the tunneling current. If this causes the tip to deflect by increase of repulsive magnetic forces between the disk and the probe, the servo loop will again correct the spacing so as to keep the junction resistance constant. No additional control input per se is necessary to control the probe-to-medium spacing.

By comparison, it would presumably also be possible to use a rigid probe to write data to a medium. One would typically employ an electromagnet to drive the rigid tip to emit a magnetic field which would alter the local magnetization of the medium. However, again it would not be possible to read data using the rigid tip because this does not deflect in response to the magnetic field. Thus, if a conventional rigid STM probe were used to write data, a different probe of some other type would have to be used to read data from the disk, such as the magnetic force microscopes discussed in references mentioned above. However, to provide two separate high precision probe devices would obviously be highly duplicative and wasteful of effort. Use of the separate probes would in particular complicate the addressing requirements of such a device.

It is thus evident that the use of a compliant magnetic probe is highly advantageous, because this allows the same tip to be used both for reading and writing of data to the medium. The compliant nature of the probe allows it to detect both variations in local magnetic field and variations in surface topography.

It will also be appreciated that variations in local magnetic field can be caused by designedly writing data to the medium or simply due to statistical variations in the manufacturing process or the like. Both will be detected by the compliant probe according to the invention. It would be preferable to write data such that the variations in local magnetic field thus provided were greater than any occurring due to manufacturing tolerances or the like, so that the detection process would be simplified. It is anticipated that this would normally be possible. However, if need be, it would be possible to generate a magnetic "map" of the surface prior to writing any data thereto, and compare this to maps generated in subsequent read steps to differentiate the designedly recorded variations in local magnetic field from those occurring in the manufacture of the medium.

More specifically, in some cases it may be necessary in the reading process to differentiate variation in probe-to-medium spacing due to variations in the magnetic characteristics of the surface from the surface topography of the surface. For example, features written to the medium in a particular writing operation may resemble features previously written to the medium or formed therein during manufacturing. If so, it is convenient to first generate a surface topography "map" of the surface using a conventional rigid tunneling probe or other topographic instrument. This can be done using the equipment shown in FIG. 1, after replacement of the compliant probe assembly 12 with a rigid probe as employed in the prior art. "Maps" can be plotted, responsive to variations in the probe-to-media spacing measured by variations in the servo current required to keep the tunnelling current constant, first using the compliant probe and then the rigid probe. The former map includes both magnetic and topographic features, while the latter includes only topographic features. Therefore, if the latter "map" is effectively subtracted from the former, what remains is the magnetic "map" of the surface. Alternatively, the latter map, made employing the compliant probe, may itself be sufficient to enable accurate discrimination of data subsequently written to the medium.

If the magnetic map exhibits only relatively small background magnetic features, and the variations in local magnetization caused by writing data to the surface as above are relatively large, no comparison of the map to a map recorded previously need be made in order to detect the data. Thus, it is desirable that data be written to the surface of the medium so as to be readily distinguishable from the background magnetization of the disk and the topography of the disk without reference to a previously recorded map or the like.

An overall flow diagram of a process for generating magnetic and topographic maps of the medium and then using them for reading and writing data is shown in FIG. 4. As noted above, it will often be possible to simplify this process considerably. In optional step 40 the surface of the medium is scanned using a rigid conventional STM probe and the surface topography is stored. It will be recognized that, in some cases, the surface may have flaws or the like which would necessitate a deliberate variation in the scan height of the probe over the disk to avoid contact. Any such flaws or other gross features would be detected in this step. In some cases it would be desirable to purposely provide gross topographic features on the surface of the magnetic media as position indicators or reference points to stored magnetic data.

In step 42, the surface is scanned, this time using a compliant probe according to the invention, wherein variation in the servo signal necessary to keep the tunneling current constant is a convolution of local magnetization as well as the surface topography. Optionally, the results of steps 40 and 42 can be compared in step 44 to determine a map from which the topographic features have effectively been removed, leaving only the magnetic features as part of the map.

In order to write data to the medium, in step 46 the compliant probe is scanned over the surface of the medium, and the tunneling current is varied by increasing the drive signal from source 20. Data can thus be written to the medium by varying the local magnetic characteristics thereof. Alternatively, this could be done by energizing an electromagnet in place of the permanent magnet 32 (FIG. 2) to increase the magnetization of the probe, and/or by reducing the scan rate of the probe with respect to the medium.

In order to read data from the disk, step 42 is effectively repeated as step 48; that is, the compliant probe is scanned over the surface and the servo signal required to maintain the probe-to-medium spacing constant is monitored.

As indicated above, in some cases it may be desirable to subtract a "map" generated in such a read step from a previously recorded magnetic map, which may in turn have been generated by comparing a map of the surface including both magnetic and topographic features from one including only topographic features. Preferably, this complexity will be avoided by writing the data so as to be substantially distinct from the normal magnetization of the medium and readily distinguishable therefrom. In this case only steps 46 and 48 are required, to write and read data, respectively.

Data can of course be written to the medium in accordance with any of a number of well known encoding techniques, e.g. can be organized into records making up tracks on a disk, or the like. Such techniques where within the skill of the art are considered within the teachings of this application.

While as mentioned above numerous alternatives and variations on the method and apparatus of the invention have been mentioned, these should not be considered as limitations on its scope but merely as exemplary of a presently preferred embodiment. In particular, the compliant probe can be used to distinguish other variations in local characteristics, e.g. stored charge as discussed in the Duerig et al patent mentioned above, from surface topographic featurest and may also be used to cause such variations. Such a compliant probe may also be useful in locally altering chemical characteristics of the medium, and subsequently detecting these modifications. The proper scope of the invention is defined by the following claims.

In addition, the process of the invention includes imaging the surface of a magnetic medium using the compliant probe of the invention to generate a magnetic mad of its surface. Such a process would be useful in research and development of magnetic materials and magnetic recording devices. The probe of the invention would thus be used as a diagnostic tool, not for storage of data per se.

The proper scope of the invention is therefore defined only by the following claims.

We claim:

1. An apparatus for controllably altering the local surface characteristics of an electrically conductive material, comprising:
   a controller for providing a control signal defining desired alteration of the local surface characteristics of said material;
   a probe formed of a mechanically compliant conductive film, having a sharp point;
   means for controllably juxtaposing the point of the probe to the conductive material;
   means for applying an electrical potential between the probe and the conductive material;
   means for detecting the flow of a tunneling current between the probe and the conductive material;
   servo loop means for maintaining the spacing of the point of the probe from the conductive material constant, said servo loop means being responsive to a servo signal derived from the detected tunneling current;
   means for altering the local surface characteristics of a region of the conductive material in juxtaposition to the probe in response to the control signal; and
   means for scanning the probe with respect to the conductive material at a scanning rate while locally altering the surface characteristics of the conductive material in response to the control signal and maintaining the spacing of the point of the probe from the surface constant.

2. The apparatus of claim 1 wherein the probe is magnetic and the local surface characteristics of the conductive material altered in response to the control signal include near-surface magnetization.

3. The apparatus of claim 2 further comprising means for magnetizing the probe.

4. The apparatus of claim 3 whereby said means for magnetizing is a permanent magnet juxtaposed to the probe.

5. The apparatus of claim 3 wherein the means for magnetizing the probe is an electromagnet juxtaposed thereto.

6. The apparatus of claim 2 wherein the probe comprises a thin film of Fe.

7. The apparatus of claim 6 wherein said Fe film is coated with a layer of Au.

8. The apparatus of claim 2 wherein the probe comprises a thin film of Ni.

9. The apparatus of claim 8 wherein said Ni film is coated with a layer of Au.

10. The apparatus of claim 1, wherein the scanning rate is effectively varied, the tunneling current is varied, and/or the magnetization of the probe is varied, in order to locally alter the surface characteristics of the material responsive to the control signal.

11. An apparatus for reading data from and writing data to a magnetizable recording member having a magnetized surface, comprising:
    a compliant magnetic probe having an extremely sharp magnetized point;
    means for controllably juxtaposing the point of the probe to the surface of the recording member;

means for applying a potential between the probe and the recording member;

means for measurement of a tunneling current passing between the point of the probe and the recording member; means for mechanically scanning the point of the probe over the recording member;

means for servo control of the spacing of the point of the probe from the surface of the recording member, responsive to a control signal derived from the tunneling current, so as to normally maintain the tunneling current at a constant nominal value;

means for varying the tunneling current from said constant nominal value in order to write data to the recording member; and means for detection of data written to the recording member responsive to variation in the measured tunneling current.

12. The apparatus of claim 11 wherein a magnetic force exists between the probe and the surface of the recording member, and data is written to the surface by increasing the tunneling current from said constant nominal value.

13. The apparatus of claim 11 further comprising means for varying the scan rate of the probe with respect to the recording member in order to write data to the recording member.

14. The apparatus of claim 11 wherein the probe is controllably magnetized by an electromagnet juxtaposed thereto in order to write data to the recording member.

* * * * *